US008798105B2

(12) United States Patent
McCarthy et al.

(10) Patent No.: US 8,798,105 B2
(45) Date of Patent: Aug. 5, 2014

(54) END-PUMPED ALIGNMENT AND TEMPERATURE INSENSITIVE LASER TARGET DESIGNATOR AND MARKER

(75) Inventors: John C. McCarthy, Newmarket, NH (US); Katherine J. Snell, Nashua, NH (US); Christopher A. Miller, Mont Vernon, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 13/885,488

(22) PCT Filed: Jul. 18, 2012

(86) PCT No.: PCT/US2012/047095
§ 371 (c)(1),
(2), (4) Date: May 15, 2013

(87) PCT Pub. No.: WO2013/028285
PCT Pub. Date: Feb. 28, 2013

(65) Prior Publication Data
US 2013/0230062 A1 Sep. 5, 2013

Related U.S. Application Data

(60) Provisional application No. 61/527,232, filed on Aug. 25, 2011.

(51) Int. Cl.
*H01S 3/11* (2006.01)
*H01S 3/0941* (2006.01)
*H01S 3/08* (2006.01)
*H01S 3/081* (2006.01)
*H01S 3/06* (2006.01)

(52) U.S. Cl.
CPC .............. *H01S 3/11* (2013.01); *H01S 3/08095* (2013.01); *H01S 3/09415* (2013.01); *H01S 3/0816* (2013.01); *H01S 3/08059* (2013.01); *H01S 3/0621* (2013.01)

USPC .................. 372/10; 372/21; 372/22; 372/27; 372/70; 372/71; 372/92; 372/93; 372/94; 372/97

(58) Field of Classification Search
CPC . H01S 3/109; H01S 3/08059; H01S 3/08004; H01S 3/08; H01S 3/09415; H01S 3/0813; H01S 3/11; H01S 3/0816; H01S 3/0621; H01S 3/08095; H01S 5/4012; H01S 3/10061; H01S 5/5036; H01S 3/081; H01S 3/0823
USPC ............ 372/10, 21, 22, 27, 70, 71, 92–94, 97
See application file for complete search history.

(56) References Cited

U.S. PATENT DOCUMENTS 3,924,201 A * 12/1975 Crow ............................ 372/108
4,408,334 A * 10/1983 Lundstrom ..................... 372/98
(Continued)

OTHER PUBLICATIONS

PCT/US2012/047095 International Search Report mailed Oct. 4, 2012.

*Primary Examiner* — Colleen A Matthews
*Assistant Examiner* — Delma R Forde
(74) *Attorney, Agent, or Firm* — Daniel J. Long (57) ABSTRACT

A compact, lightweight, laser target designator uses a TIR bounce geometry to place an end-pumped gain element functionally in the center of the resonator path, thereby allowing the resonator path to be terminated by a pair of crossed Porro prisms, so that the designator produces a high quality beam that is insensitive to alignment and temperature, and is low in manufacturing cost. Some embodiments fold the Porro legs of the resonator path back toward the gain element for compactness. Embodiments use a single gain element as both an oscillator gain element with TIR and as an output amplifier gain element without TIR. Various embodiments use block optical elements in a planar layout on a standard support medium such as aluminum to facilitate automated manufacturing.

13 Claims, 7 Drawing Sheets

(56) References Cited

U.S. PATENT DOCUMENTS

| | | | |
|---|---|---|---|
| 4,461,009 A * | 7/1984 | Lundstrom | 372/108 |
| 5,796,770 A * | 8/1998 | Gregor et al. | 372/75 |
| 6,999,491 B2 * | 2/2006 | Rieger et al. | 372/75 |
| 7,035,025 B2 | 4/2006 | Prince et al. | |
| 7,039,087 B2 | 5/2006 | Nettleton et al. | |
| 7,289,548 B2 * | 10/2007 | Ishizu | 372/94 |
| 7,430,231 B2 | 9/2008 | Luo et al. | |
| 7,720,126 B2 | 5/2010 | McCarthy | |
| 2013/0308176 A1 * | 11/2013 | Rockwell et al. | 359/327 |
| 2013/0308177 A1 * | 11/2013 | Rockwell et al. | 359/327 |

* cited by examiner

END-PUMPED ALIGNMENT AND TEMPERATURE INSENSITIVE LASER TARGET DESIGNATOR AND MARKER

RELATED APPLICATIONS

This application is a national phase application filed under 35 USC §371 of PCT application PCT/US2012/047095, filed on Jul. 18, 2012, which claims the benefit of U.S. Provisional Application No. 61/527,232, filed Aug. 25, 2011. Both applications are which is herein incorporated by reference in their entirety for all purposes.

FIELD OF THE INVENTION

The invention relates to laser target designators, and more particularly, to laser target designators that incorporate end-pumped gain media.

BACKGROUND OF THE INVENTION

A laser designator is a laser light source which is used to designate a military target. Laser designators provide targeting for laser guided bombs, missiles, and precision artillery munitions. The designator is used to apply laser light to the target, causing the light to bounce off the target into the sky, where it is detected by the seeker on a laser guided munition, which steers itself towards the source of the reflected light.

Typically, when a target is marked by a designator, the beam does not shine continuously. Instead, a series of pulses of laser-light are fired, and the pulsing rate is used as an identifying code. This allows a plurality of targets to be simultaneously marked with different pulsing rates, so that each of a corresponding plurality of munitions can be programmed to recognize and be guided only by a laser designation having a specific pulsing rate.

Figure 1:
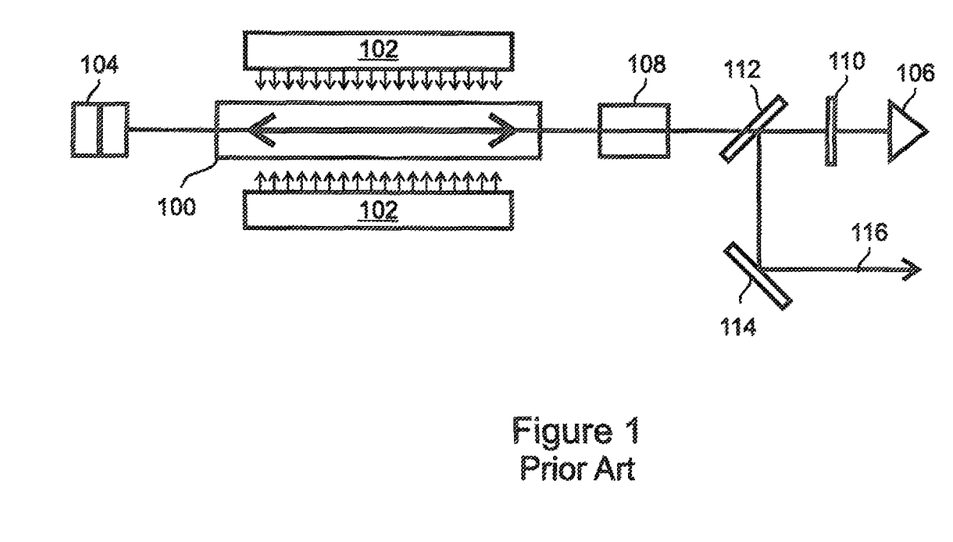
FIG. 1 is a block diagram illustrating a side-pumped laser designator configuration of the prior art.

A simplified diagram of a typical laser designator of the prior art is presented in FIG. 1. A laser gain medium such as neodymium doped yttrium aluminum garnet (ND:YAG) 100 is located in the center of an optical resonator and is pumped from the side by pumping diodes 102. The optical resonator is terminated by a horizontal Porro prism 104 at one end and by a vertical Porro prism 106 at the other end. A passive or active Q-switch 108 located within the resonator causes the laser light to be emitted in pulses, and a quarter wave plate 110 in combination with a polarized reflector 112 and a mirror 114 provide output 116 from the resonator.

The use of Porro prisms 104, 106 instead of end mirrors to terminate the ends of the optical resonator path eliminates the need for critically accurate alignment of the resonator components. In addition, use of the Porro prisms 104, 106 significantly reduces the sensitivity of the resonator to thermal effects, such as thermal expansion of the mounting platform (not shown, typically aluminum), thermal lensing within the laser, thermal drift of the resonator components 110, 112, and thermal drift of the pulsing rate (in the case of a passive Q-switch 108).

Unfortunately, currently deployed laser designating systems such as the design illustrated in FIG. 1 tend to be heavy and bulky, and require assembly in the field, thereby reducing their effectiveness, especially for dismounted observers. The bulk and weight of the units also prevents deployment of laser designating systems as one-man portable systems, for example by integrating the designator into a self-contained sight that also provides precision targeting data.

Much of the weight and bulk of the current designs arises from the use of a side-pumped laser gain element 100.

Figure 2:
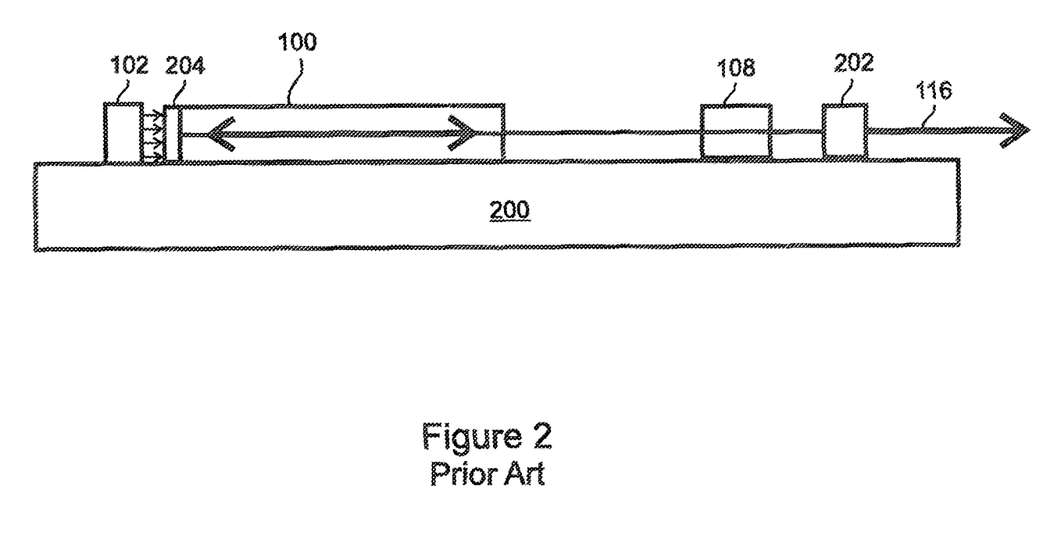
FIG. 2 is a block diagram illustrating an end-pumped laser designator configuration of the prior art.

Attempts have been made to design a more compact and lighter laser designator using an end-pumped gain element 100. An example is illustrated in FIG. 2, where a Nd:YAG gain medium 100 is pumped from one end by pumping diodes 102. In this arrangement, a highly reflective mirror 204 deposited directly on the gain element itself 100 terminates the optical resonator path at one end, and a single partially transmitting mirror 202 terminates the resonator path at the other end. This approach minimizes the number of components, and reduces bulk and weight by using an end-pumped gain element 100.

However, since the highly reflective mirror 204 is deposited on the gain element 100 at one end of the resonator path, it is not possible to use a pair of Porro prisms as the terminators of both ends of the resonator path. As a result, the alignment of the resonator components 100, 108, 202 is highly critical.

In the design illustrated in FIG. 2, "monoblock" construction is used to directly and rigidly bond and align all of the resonator elements on a common, temperature compensated, optical quality support rail 200. However, this approach significantly increases the cost of materials and of assembly. In addition, even if the internal temperature of the designator is regulated, the use of an optical-quality rail 200 does not compensate for thermal lensing of the gain medium 100 and the resulting mirror misalignments due to variations in average output power due to differing pulse rate codes.

In addition, the length of the gain medium 100 must be sufficient to provide both the required target designation brightness and the laser pulse width, which places a limit on the minimum length of the designator.

What is needed, therefore, is a high beam quality laser designator design that is insensitive to temperature and to alignment, compact and lightweight, and low in manufacturing cost.

SUMMARY OF THE INVENTION

A laser target designator includes a novel optical resonator design that uses a total internal reflection "bounce" geometry to place an end-pumped gain element functionally in the center of the resonator path, thereby allowing the resonator path to be terminated at both ends by a pair of Porro prisms and providing a high beam quality design that is insensitive to temperature and to alignment, compact, light in weight, and low in manufacturing cost. Embodiments use the same gain medium as an oscillator gain medium and an amplifier gain medium.

In the present invention, light within the resonator enters the gain element at an angle and undergoes total internal reflection or "TIR," Herein this is referred to as a "bounce" geometry. Upon entering the gain element at an angle, the oscillator light undergoes a plurality of internal reflections before emerging from the same end of the gain element at a symmetrically opposite angle. This bounce geometry requires that the beam be reflected back to the gain element from two locations, and thereby functionally places the gain element at the center of the resonator path.

By using this bounce geometry to place the gain element in the center of the optical resonator, the present design allows both ends of the resonator to be terminated by crossed Porro prisms, thereby providing the insensitivity to alignment and to temperature typically achieved by conventional designs that use side-pumped gain elements (see FIG. 1), but with greatly reduced bulk and weight. Due to this alignment insensitivity, embodiments of the invention incorporate block optics in a planar layout that provides a suitable platform for automated assembly on a standard support media such as aluminum.

The bounce geometry of the present invention also limits the effective aperture of the gain element, thereby reducing beam divergence and improving the quality of the beam. The improved beam quality allows the transmit optic diameter to be minimized, thereby reducing the power required to achieve a desired target brightness, and further reducing the weight and size of the designator.

In addition, the internal reflectance of the light within the gain element causes the light to traverse an increased path length within the gain element. This allows the oscillator to be operated using a smaller mode volume to generate a high brightness beam, thereby providing gain that would be typical of a much longer gain element that did not use a bounce geometry. As a result, the physical length of the gain element, and of the designator as a whole, is further reduced.

Certain embodiments of the present invention use a single gain element as both an oscillator gain element and an amplifier gain element. In some of these embodiments, the oscillator beam undergoes total internal reflection within the gain medium, while the extracted output beam passes twice more through the same gain medium without internal reflection, thereby maximizing the use of the gain element volume for increased laser energy without degrading the fundamental oscillator beam quality or efficiency.

One general aspect of the present invention is a laser target designator that includes a gain element having a primary axis terminated by a front end and a back end, a pumping source cooperative with the gain element and configured to transmit optical pumping energy into the gain element through its back end, a first Porro prism positioned to intercept light emerging at a first angle from the front end of the gain element and oriented to reflect the light back into the front end of the gain element, a second Porro prism positioned to intercept light emerging at a second angle from the front end of the gain element and oriented to reflect the light back into the front end of the gain element, the second Porro prism having a crossed orientation relative to the first Porro prism, the gain element and the first and second Porro prisms forming an optical resonator path in which light, reflected by the first Porro prism travels through a first Porro leg, enters the front end of the gain element at the first angle, undergoes total internal reflection within the gain element and is amplified thereby, emerges from the front end of the gain element at the second angle, travels through a second Porro leg, and strikes the second Porro prism, the light being thereby reflected so that it substantially reverses its path and returns through the gain element to the first Porro prism, and a beam extraction mechanism intersecting the resonator path and configured to extract a portion of the light in the resonator path to form an output beam.

Embodiments further include a Q-switch intersecting the resonator path. In some embodiments the Q-switch is actively switched. In other embodiments the Q-switch is passively switched.

In various embodiments the gain element, the pumping source, the Porro prisms, and the extraction mechanism are all block optical elements configured in a planar layout.

In certain embodiments the gain element has a rectangular cross sectional shape normal to the primary axis. In some of these embodiments the pumping source includes pump diodes arranged in a two-dimensional array of quasi-continuous wave bars.

In some embodiments the pumping source includes a vertical-cavity surface-emitting laser. Other embodiments further include a first optical wedge configured to direct light from the front end of the gain element to the first Porro prism and a second optical wedge configured to direct light from the front end of the gain element to the second Porro prism.

Various embodiments further include a first adjustable circular wedge cooperative with the first Porro prism and configured to enable adjustment of the alignment between the resonator path and the first Porro prism, and a second adjustable circular wedge cooperative with the second Porro prism and configured to enable adjustment of the alignment between the resonator path and the second Porro prism.

Certain embodiments further include at least one reflective element that folds the first Porro leg back toward the gain element.

In some embodiments at least one of the Porro prisms is configured to undergo a variable rotation that adjusts a quality of the light reflected thereby.

In other embodiments the designator is incorporated into a self-contained sight that provides both precision targeting data and target marking capability.

And in certain embodiments the beam extraction mechanism is configured to direct the output beam toward the front end of the gain element so that the output beam passes twice through the gain element without internal reflection, thereby amplifying the output beam before it emerges from the designator.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 3:
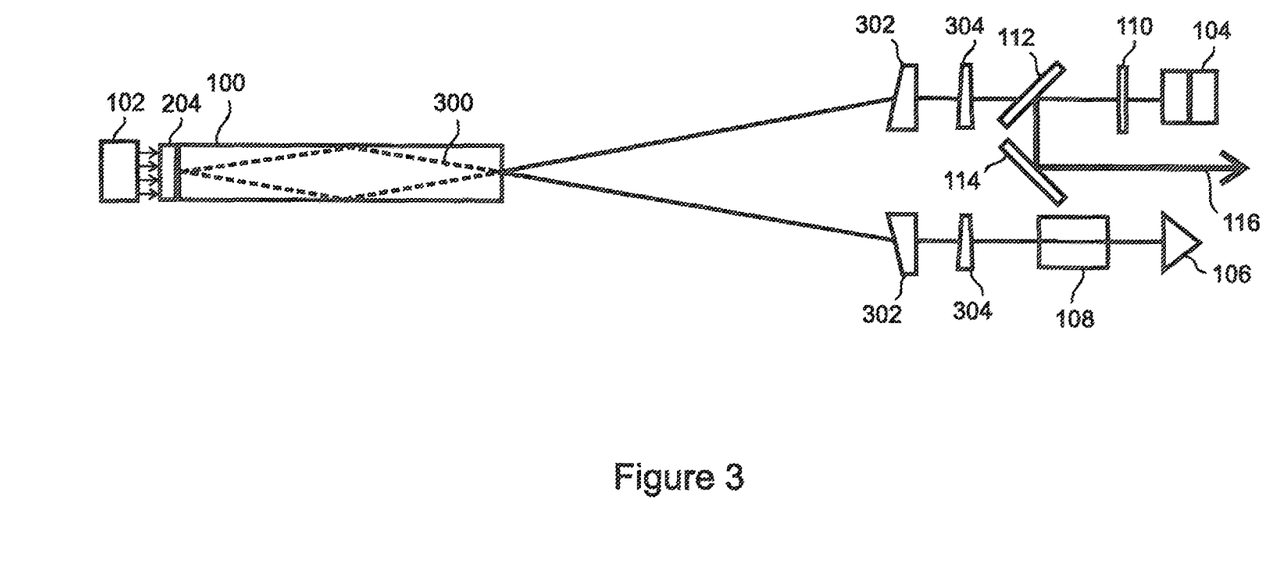
FIG. 3 is a block diagram illustrating an embodiment of the present invention.

With reference to FIG. 3, the present invention is a laser target designator having a novel optical resonator design that uses a bounce geometry to place an end-pumped gain element 100 functionally in the center of the resonator, thereby allowing the resonator to be terminated by a pair of Porro prisms 104, 106 and providing a high beam quality design that is insensitive to temperature, insensitive to alignment, compact, light in weight, and low in manufacturing cost.

As can be seen in FIG. 3, the light within the resonator 300 enters the gain element 100 at an angle and undergoes total internal reflection or "TIR." Herein this TIR configuration is referred to as a "bounce" geometry. After undergoing TIR, the oscillator light emerges from the gain element 100 at a symmetrically opposite angle.

This bounce geometry requires that the beam be reflected back to the gain element 100 from two locations, and thereby functionally places the gain element 100 at the center of the resonator.

By using a bounce geometry to place the end-pumped gain element 100 in the center of the optical resonator, the present invention allows both ends of the resonator to be terminated by Porro prisms 104, 106, thereby providing the insensitivity to alignment and to temperature typically achieved by conventional side-pumped designs (see FIG. 1), but with greatly reduced bulk and weight. Due to this alignment insensitivity, embodiments of the invention incorporate block optics in a planar layout that provides a suitable platform for automated assembly.

The bounce geometry of the present invention also limits the effective aperture of the gain element (since the oscillator light enters the gain element 100 at an angle), thereby reducing output beam divergence and improving the quality of the beam. This improved beam quality allows the transmit optic diameter to be minimized, thereby requiring less power for a desired target optical brightness, and further reducing the weight and size of the designator.

The internal reflectance of the light 300 within the gain element causes the light to traverse an increased path length within the gain element, thereby providing oscillator gain that would be typical of a much longer gain element that did not use a bounce geometry. This allows the oscillator to be operated using a small mode volume to generate a high brightness beam. As a result, the physical length of the gain element, and of the designator as a whole, is farther reduced.

In the embodiment of FIG. 3, the block gain element 100 has a rectangular geometry, and is end-pumped with a standard pump diode stack 102 comprising a two-dimensional array of quasi-continuous wave bars. The rectangular geometry of the gain element 100 accommodates the asymmetric diode stack divergence to provide uniform pump deposition in the gain media. In embodiments, a combination of parallelepiped gain block geometry 100 and use of commercial "off the shelf" (COTS) elements provides uniform pump deposition using direct asymmetrical diode output. In similar embodiments, the gain block 100 is pumped with the symmetrical output of a vertical-cavity surface-emitting laser (VCSEL), which also creates a uniform pump deposition.

The embodiment of FIG. 3 further includes a square wedge 302 in each Porro leg, with the wedge angle arranged to center the optical axis on the Porro prism knife edge. This configuration also allows each Porro prism to be rotated to adjust the phase retardation to compensate a portion of the induced birefringence in the gain block 100 and/or for setting the output coupling reflectivity, thereby allowing only one quarter wave-plate 110 to be used. The combination of the planer layout and block optics in the embodiment of FIG. 3 is a suitable configuration for automated "pick and place" assembly onto a standard mounting substrate such as aluminum, allowing for high volume, low cost production. Depending on the precision of the automated assembly, an additional adjustable circular wedge 304 is contained in each Porro leg to fine tune the oscillator if needed.

In embodiments, the oscillator architecture of FIG. 3 includes either a passive Q-switch 108 or an active Q-switch 108. The roof angle orientations of the Porro prisms 104, 106 with respect to the optical axis of the gain element 100 may be adjusted to homogenize special extraction of the output beam 116. The roof angles may also be adjusted to provide beam phase control, allowing elimination of a waveplate and/or to compensate for birefringence loss.

Figure 4:
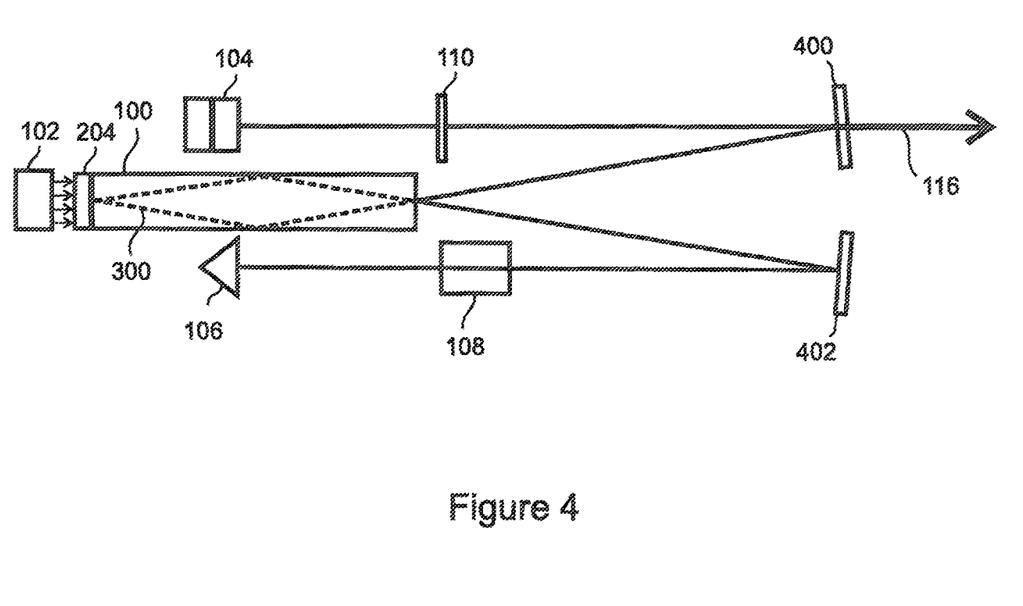
FIG. 4 is a block diagram illustrating an embodiment similar to the embodiment of FIG. 3, but with a folded geometry.

FIG. 4 illustrates an embodiment wherein a partially transmitting mirror 400 and a fully reflecting mirror 402 are used to fold the two Porro legs back toward the gain element 100, thereby providing a highly compact geometry. Embodiments using this approach can be incorporated into a self-contained sight that provides both precision targeting data and target marking capability.

Figure 5A:
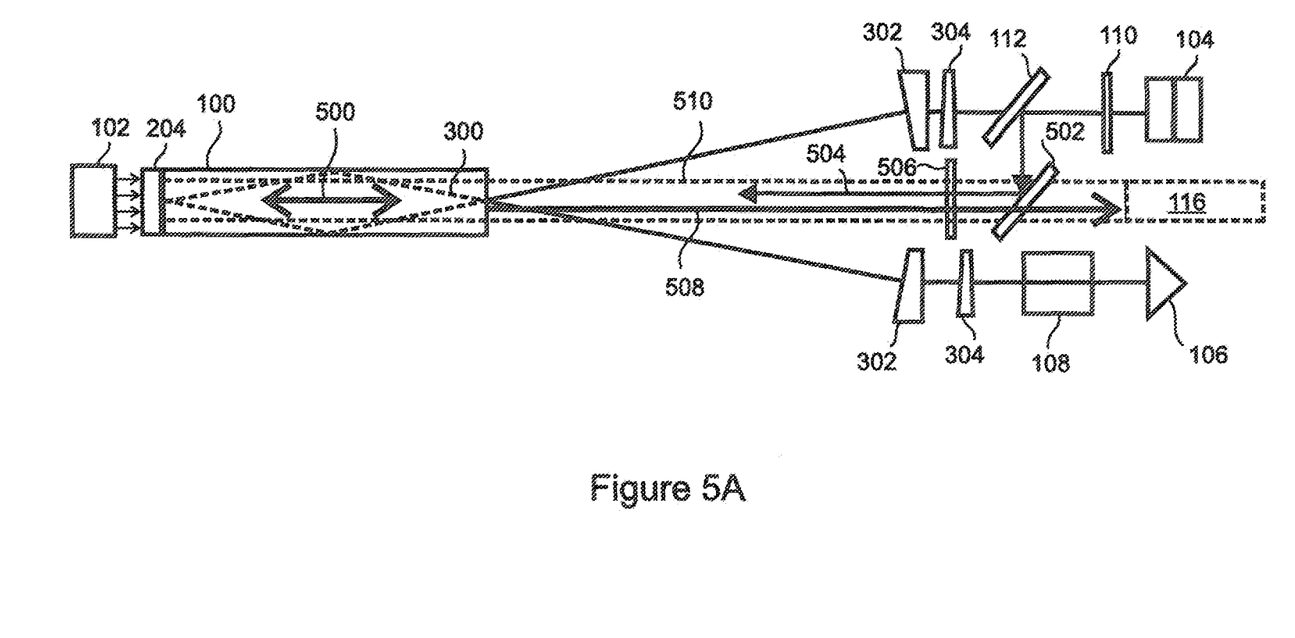
FIG. 5A is a block diagram illustrating an embodiment of the present invention in which the same gain medium is used as both an oscillator gain medium and an amplifier gain medium.

With reference to FIG. 5A, certain embodiments of the present invention use a single gain 100 element as both an oscillator gain element and an amplifier gain element. In the embodiment of FIG. 5A (as compared to FIG. 3), a total reflectance mirror 114 has been replaced by a partially transmitting mirror 502 and has been oriented to redirect the output beam 504 through a quarter wave element 506 and into the gain element 100 before the beam 508 emerges 116 from the designator. The output beams 504, 508 entering and leaving the gain element 100 have been offset from each other in the figure for clarity of illustration. In fact, in the actual embodiment they overlap.

In the embodiment of FIG. 5A, the oscillator beam undergoes transverse internal reflection 300 within the gain element, while the extracted output beam passes twice once more 500 through the same gain element 100 without internal reflection, thereby maximizing the use of the gain element volume 100 for increased laser energy without degrading the fundamental oscillator beam quality or efficiency. In embodiments, the higher beam quality oscillator output is amplified as shown in FIG. 5A to an equivalent pulse energy that would be obtained if the gain element was operated as a conventional fully extracted gain element 510.

Figure 5B:
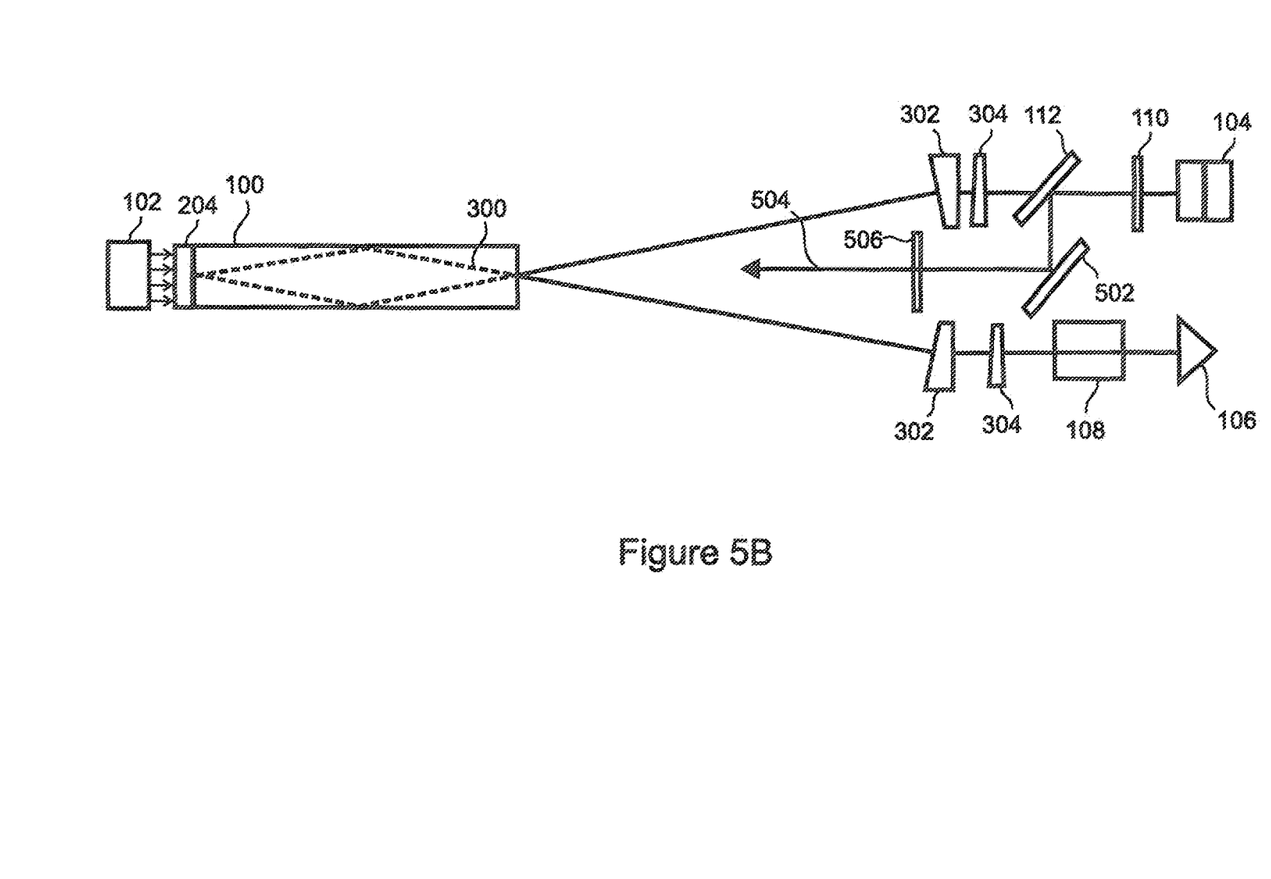
FIG. 5B is a block diagram illustrating only the oscillator portion of the embodiment of FIG. 5A.
Figure 5C:
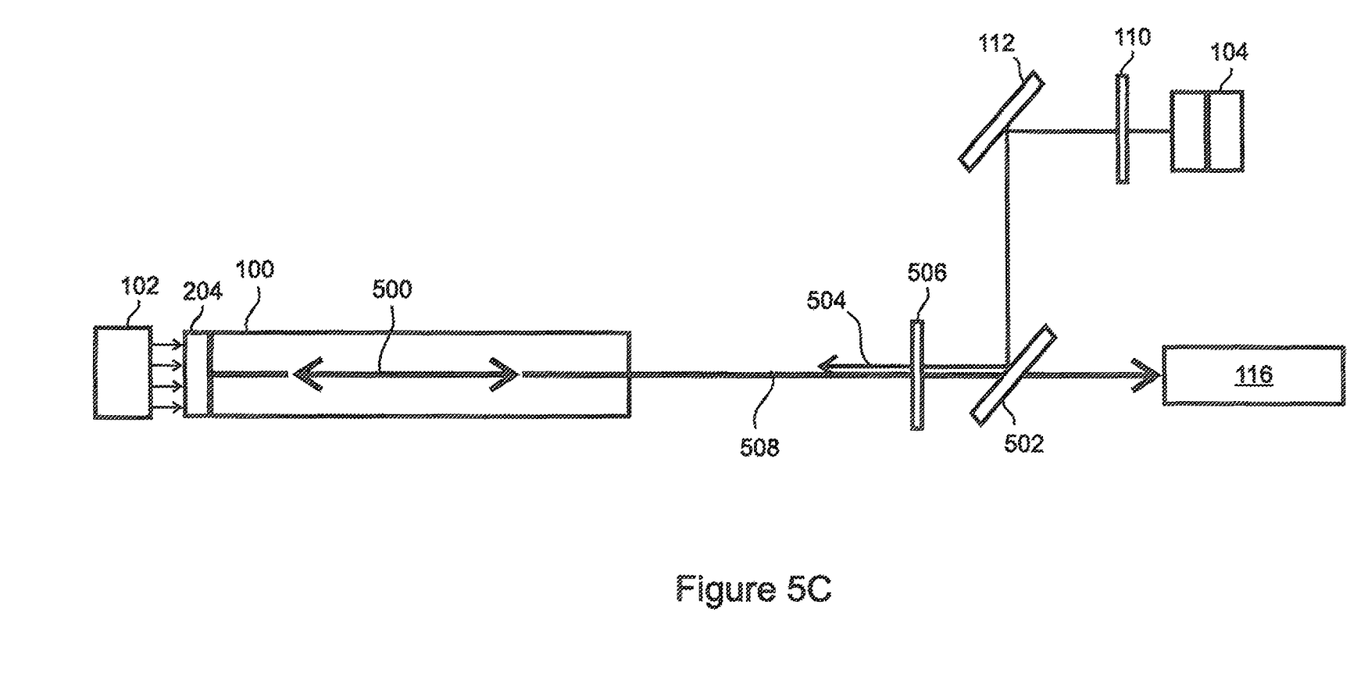
FIG. 5C is a block diagram illustrating only the amplifier portion of the embodiment of FIG. 5A.

FIGS. 5B and 5C are block diagrams illustrating only the oscillator portion and only the amplifier portion respectively of the embodiment of FIG. 5A The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A laser target designator, comprising:
a gain element having a primary axis terminated by a front end and a back end;
a pumping source cooperative with the gain element and configured to transmit optical pumping energy into the gain element through its back end;
a first Porro prism positioned to intercept light emerging at a first angle from the front end of the gain element and oriented to reflect the light back into the front end of the gain element;
a second Porro prism positioned to intercept light emerging at a second angle from the front end of the gain element and oriented to reflect the light back into the front end of the gain element, the second Porro prism having a crossed orientation relative to the first Porro prism,
the gain element and the first and second Porro prisms forming an optical resonator path in which light reflected by the first Porro prism travels through a first Porro leg, enters the front end of the gain element at the first angle, undergoes total internal reflection within the gain element and is amplified thereby, emerges from the front end of the gain element at the second angle, travels through a second Porro leg, and strikes the second Porro prism, the light being thereby reflected so that it substantially reverses its path and returns through the gain element to the first Porro prism; and a beam extraction mechanism intersecting the resonator path and configured to extract a portion of the light in the resonator path to form an output beam, the beam extraction mechanism being configured to direct the output beam toward the front end of the gain element so that the output beam passes twice through the gain element without internal reflection, thereby amplifying the output beam before it emerges from the designator.

2. The designator of claim 1, further comprising a Q-switch intersecting the resonator path.

3. The designator of claim 2, wherein the Q-switch is actively switched.

4. The designator of claim 2, wherein the Q-switch is passively switched.

5. The designator of claim 1, wherein the gain element, the pumping source, the Porro prisms, and the extraction mechanism are all block optical elements configured in a planar layout.

6. The designator of claim 1, wherein the gain element has a rectangular cross sectional shape normal to the primary axis.

7. The designator of claim 6, wherein the pumping source includes pump diodes arranged in a two-dimensional array of quasi-continuous wave bars.

8. The designator of claim 1, wherein the pumping source includes a vertical-cavity surface-emitting laser.

9. The designator of claim 1, further comprising a first optical wedge configured to direct light from the front end of the gain element to the first Porro prism and a second optical wedge configured to direct light from the front end of the gain element to the second Porro prism.

10. The designator of claim 1, further comprising a first adjustable circular wedge cooperative with the first Porro prism and configured to enable adjustment of the alignment between the resonator path and the first Porro prism, and a second adjustable circular wedge cooperative with the second Porro prism and configured to enable adjustment of the alignment between the resonator path and the second Porro prism.

11. The designator of claim 1, further comprising at least one reflective element that folds the first Porro leg back toward the gain element.

12. The designator of claim 1, wherein at least one of the Porro prisms is configured to undergo a variable rotation that adjusts a quality of the light reflected thereby.

13. The designator of claim 1, wherein the designator is incorporated into a self-contained sight that provides both precision targeting data and target marking capability.

* * * * *